United States Patent
Persson et al.

(10) Patent No.: US 9,432,050 B2
(45) Date of Patent: Aug. 30, 2016

(54) SOFTWARE UPGRADING IN A NETWORK

(71) Applicant: TELEFONAKTIEBOLAGET L M ERICSSON (PUBL), Stockholm (SE)

(72) Inventors: Fredrik Persson, Märsta (SE); Jens Knutsson, Enebyberg (SE); Hans Eriksson, Sollentuna (SE); Paul Stjernholm, Lidingö (SE); Lars Westberg, Enköping (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 0 days.

(21) Appl. No.: 14/406,476

(22) PCT Filed: Jun. 3, 2013

(86) PCT No.: PCT/EP2013/061381
§ 371 (c)(1),
(2) Date: Dec. 8, 2014

(87) PCT Pub. No.: WO2013/186074
PCT Pub. Date: Dec. 19, 2013

(65) Prior Publication Data
US 2015/0154013 A1    Jun. 4, 2015

Related U.S. Application Data

(60) Provisional application No. 61/659,141, filed on Jun. 13, 2012.

(51) Int. Cl.
*G06F 9/44*    (2006.01)
*H03M 7/30*    (2006.01)
(Continued)

(52) U.S. Cl.
CPC .............. *H03M 7/3059* (2013.01); *G06F 8/65* (2013.01); *H03M 7/3091* (2013.01); *H04L 67/34* (2013.01); *H04L 69/04* (2013.01)

(58) Field of Classification Search
CPC . G06F 8/60–8/77; H03M 7/30; H03M 7/3059
USPC ........................................................ 717/169
See application file for complete search history.

(56) References Cited

U.S. PATENT DOCUMENTS 5,598,354 A * 1/1997 Fang .................... G06N 3/0454
708/203
5,729,228 A * 3/1998 Franaszek ........... H03M 7/3086
341/106

(Continued)

OTHER PUBLICATIONS

Training Data Compression Algorithms and Reliability in Large Wireless Sensor Networks—Vasanth Iyer, Garimella Rammurthy, M.B. Srinivas—Communications and Networking Research Centre, Centre for VLSI and Embedded System Technologies International Institute of Information Technology Gachibowli, Hyderabad India—2008 IEEE International Conference.*

*Primary Examiner* — Francisco Aponte
(74) *Attorney, Agent, or Firm* — Patent Portfolio Builders, PLLC

(57) ABSTRACT

A method of updating data compression software. The method comprises using real-time data to train upgraded compression/decompression software. A compressor and/or decompressor function processes and delivers the real-time data using an existing compression/decompression software. Following completion of the training process, the compressor and/or decompressor deactivates the existing compression/decompression software and activates the upgraded compression/decompression software to process and deliver the real-time data.

21 Claims, 5 Drawing Sheets

(51) Int. Cl.
*H04L 29/08* (2006.01)
*H04L 29/06* (2006.01)
*G06F 9/445* (2006.01)

(56) References Cited

U.S. PATENT DOCUMENTS

| | | | | |
|---|---|---|---|---|
| 5,856,975 A * | 1/1999 | Rostoker | ............... | G06F 13/128 348/467 |
| 6,400,289 B1 * | 6/2002 | Banerji | ................... | H03M 7/30 341/60 |
| 6,492,917 B1 * | 12/2002 | Goel | ....................... | H03M 7/30 341/50 |
| 6,624,761 B2 * | 9/2003 | Fallon | ........................ | G06T 9/00 341/51 |
| 6,704,718 B2 * | 3/2004 | Burges | ................. | H04N 19/105 375/E7.048 |
| 6,750,791 B1 * | 6/2004 | Liu | ......................... | G06T 9/001 341/51 |
| 6,762,699 B1 * | 7/2004 | Yang | ................... | H03M 7/3084 341/106 |
| 6,879,631 B1 * | 4/2005 | Schultz | ............... | H04N 19/436 348/400.1 |
| 6,963,570 B1 * | 11/2005 | Agarwal | ............... | H04L 1/0009 370/310.2 |
| 7,251,231 B2 * | 7/2007 | Gubbi | .................. | H04L 12/403 370/336 |
| 7,386,046 B2 * | 6/2008 | Fallon | ..................... | H03M 7/30 375/240 |
| 7,616,132 B2 * | 11/2009 | Chan | ................... | H03M 7/3084 341/50 |
| 8,054,879 B2 * | 11/2011 | Fallon | ..................... | H03M 7/30 375/240 |
| 8,073,047 B2 * | 12/2011 | Fallon | ..................... | H03M 7/30 375/240 |
| 8,205,011 B2 * | 6/2012 | Morikawa | ............ | H04W 28/06 709/246 |
| 8,326,906 B2 * | 12/2012 | Tsatsanis | ................ | H04B 3/32 708/308 |
| 8,553,759 B2 * | 10/2013 | Fallon | ..................... | H03M 7/30 375/240 |
| 8,620,881 B2 * | 12/2013 | Chamberlain | .......... | G06F 3/061 707/693 |
| 8,639,849 B2 * | 1/2014 | Achler | .................... | H03M 7/30 370/229 |
| 9,048,859 B2 * | 6/2015 | Carty | ..................... | G06F 9/445 |
| 9,143,546 B2 * | 9/2015 | Fallon | ................ | H04L 12/1895 |
| 2003/0154264 A1 | 8/2003 | Martin | | |
| 2010/0077141 A1 * | 3/2010 | Achler | ............... | H03M 7/3088 711/108 |

* cited by examiner

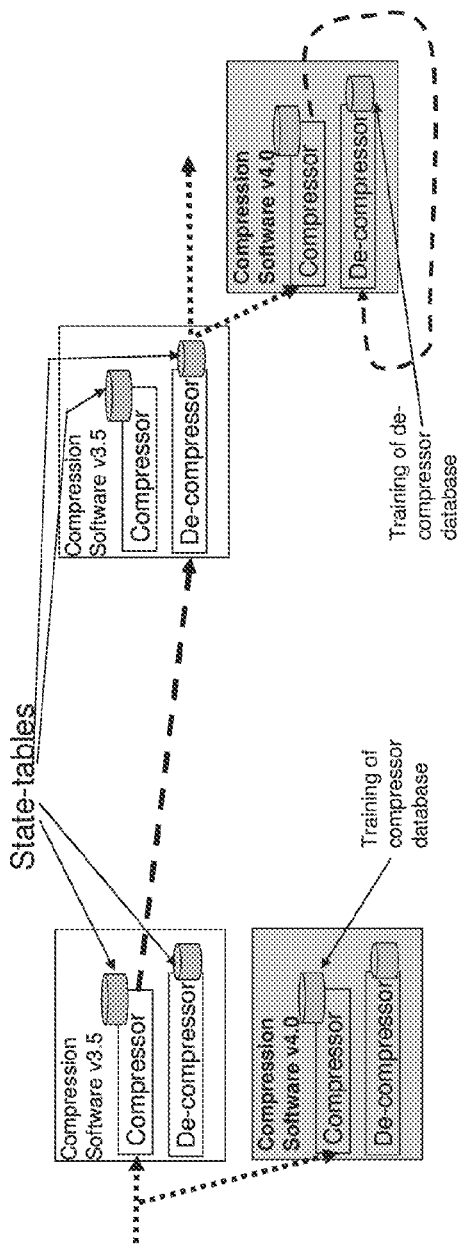
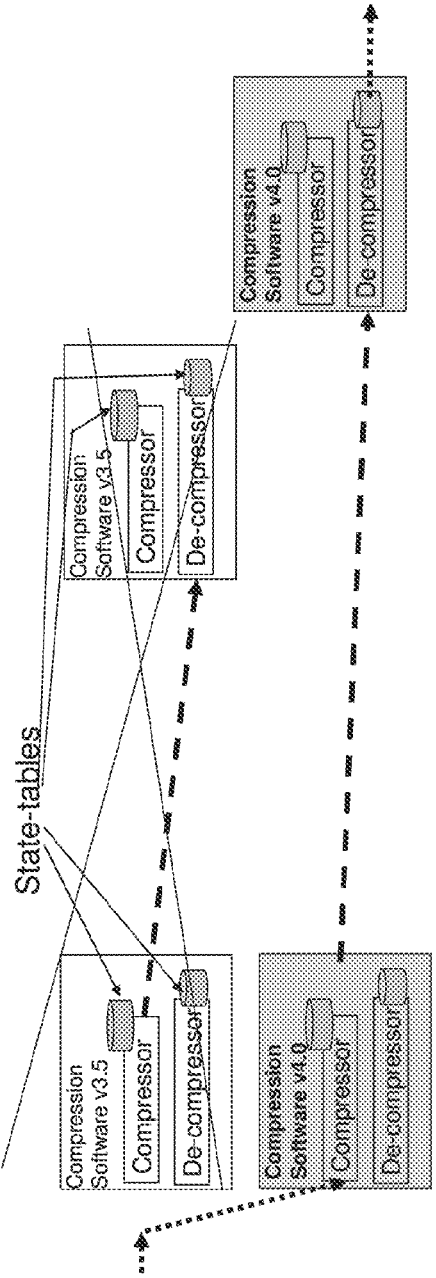
Figure 6
Figure 7

SOFTWARE UPGRADING IN A NETWORK

This application is a 371 of International Application PCT/EP2013/061381, filed Jun. 3, 2013, which claims the benefit of U.S. Provisional Application No. 61/659,141, filed Jun. 13, 2012, the disclosures of which are fully incorporated herein by reference.

BACKGROUND

Networks used for transferring data often make use of payload compression to reduce the bandwidth requirements of the network. One example of data compression is de-duplication, which is based on shortening repeated data patterns in a data stream. An example method of de-duplication is as follows:
1. The compressor identifies a repeated data pattern (denoted Gi) in the data stream.
2. The compressor replaces each occurrence of Gi with a pointer Ni. The pointer is a reference to the pattern Gi in a compression table (also referred to as a "code book" or state table).
3. The compressor repeats steps 1 and 2 for each repeated data pattern.
4. The compressor sends the data stream to the decompressor with each Gi replaced by the corresponding Ni. The compressor also sends the compression table (or any changes to the compression table) to the decompressor.
5. The decompressor receives the data stream, and replaces each occurrence of a pointer Ni by the corresponding Gi.
6. The data stream is then read by the receiver.

More advanced compression technology may include transformations to increase the probability that a duplicate can be found for a given sequence. Advanced compression technologies include header compression, e.g. Robust Header Compression (RoHC).

In practical applications, the compressor will not act on the entire media stream at once. Instead, the compressor will continually compress the stream as it is transmitted, identifying and compressing repeated data patterns as it goes along. This allows the stream to be transmitted in real time. However, when the compressor is first initialised, it must "learn" the repeated patterns for the data that flows through it, and so the compression algorithm takes significant time to converge (i.e. approach maximum efficiency). This is shown in FIG. 1.

If the compression software is updated, then the existing compression table may not be usable. In this case, the updated software will be required to generate a new compression table. While the updated software may run more efficiently once converged, this causes the flow of data over the network to be much less efficient until convergence is achieved, as shown in FIG. 2. This is clearly a problem for network operators, who must then balance long-term efficiency over short-term disruptions to the network.

Therefore, there is a need to ensure that software upgrades can be performed seamlessly in a system such as that in FIG. 3. The compression software includes both a compression and a decompression function. In the arrangement shown in FIG. 3, only the compressor is used in the left hand node, and only the decompressor in the right hand node. However, such a system may support bi-directional flows of data.

There are no known solutions for seamless upgrades to compression software. Existing architectures will generate unpredictable system performance during the upgrade such as described above.

SUMMARY

According to a first aspect of the present invention, there is provided an apparatus configured to operate as a compressor and/or decompressor. The apparatus comprises a compression/decompression processor and an update handler. The compression/decompression processor is for processing and delivering real-time data using existing compression/decompression software. The update handler is for deactivating the existing compression/decompression software and configuring the compression/decompression processor to use upgraded, trained compression/decompression software.

According to a second aspect of the present invention, there is provided an apparatus configured to operate as a compressor and/or decompressor. The apparatus comprises a storage handler and an upgrade handler. The storage handler is for storing a compression table of existing compression/decompression software. The upgrade handler is for deactivating the existing compression/decompression software and activating upgraded compression/decompression software to process and deliver real-time data in dependence upon the compression table.

According to a third aspect of the present invention, there is provided a method of updating data compression software. Real-time data is used to train upgraded compression/decompression software. A compressor and/or decompressor function processes and delivers the real-time data using an existing compression/decompression software. Following completion of the training process, the compressor and/or decompressor deactivates the existing compression/decompression software and activates the upgraded compression/decompression software to process and deliver the real-time data.

According to a fourth aspect of the present invention, there is provided a method of updating data compression/decompression software. A compressor and/or decompressor function stores a compression table of existing compression/decompression software. The compressor and/or decompressor function then deactivates the existing compression/decompression software and activates upgraded compression/decompression software to process and deliver real-time data in dependence upon the compression table.

According to a fifth aspect of the present invention, there is provided a computer program comprising computer readable code which, when run on an apparatus, causes it to behave as an apparatus or perform a method according to any of the above aspects. The computer program may be embodied on a non-transitory computer-readable medium.

BRIEF DESCRIPTION OF THE DRAWINGS

FIG. 6 illustrates the compression architecture during training of the upgraded compressor/decompressor;

FIG. 7 illustrates the compression architecture after training is completed;

DETAILED DESCRIPTION

There is a need to provide updated compression software with a compression table which will allow it to operate efficiently as soon as it is activated.

Figure 8:
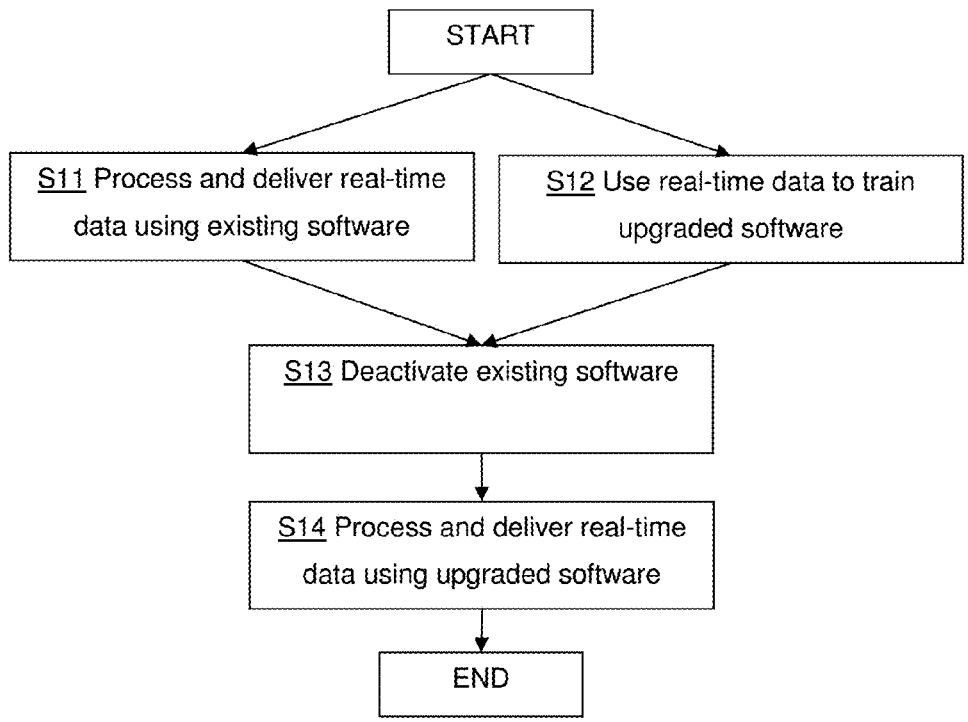
FIG. 8 is a flowchart showing a method according to one approach.
Figure 9:
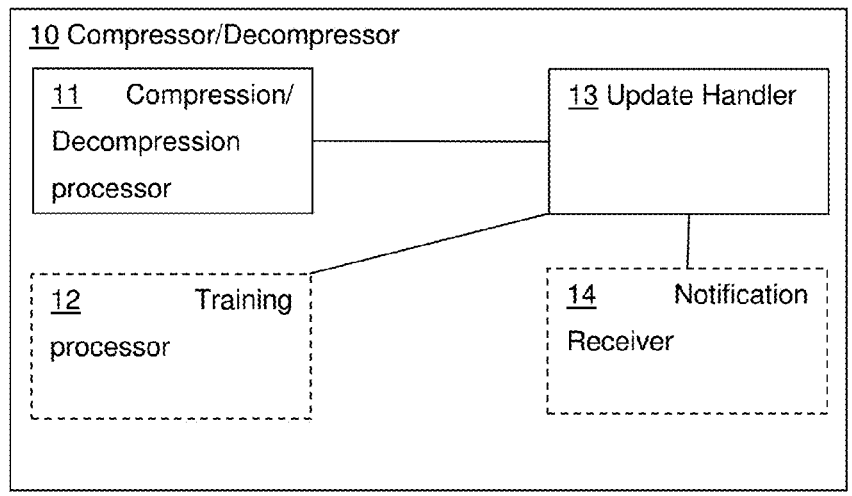
FIG. 9 illustrates schematically an apparatus for implementing the method of FIG. 8.

A first solution involves "training" the upgraded compression software by copying real-time data inputs to the existing (i.e. not upgraded) compression software and using them as inputs to the upgraded compression software. A flowchart of such a method is shown in FIG. 8, and a compressor/decompressor for implementing the method is illustrated schematically in FIG. 9.

Figures 1, 2:
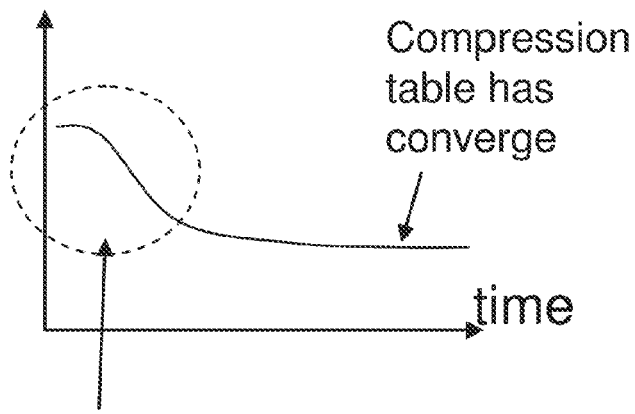
FIG. 1 illustrates the bandwidth use over time of a compressor/decompressor.
FIG. 2 illustrates the bandwidth use over time of a compressor/decompressor over multiple update cycles.
Figure 3:
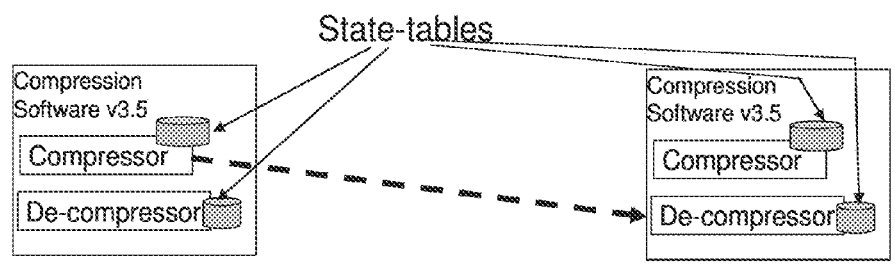
FIG. 3 illustrates a system using data compression on a point to point connection.
Figure 4:
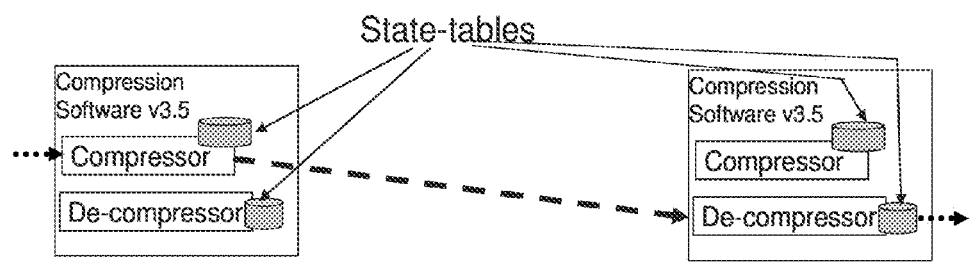
FIG. 4 illustrates the compression architecture prior to performing a software upgrade.
Figure 5:
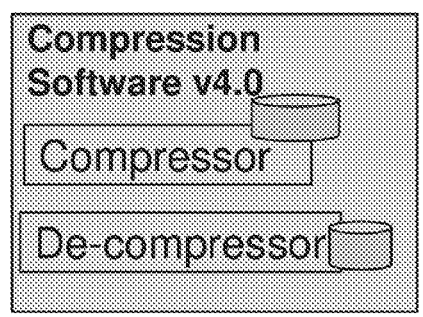
FIG. 5 illustrates the an upgraded compressor/decompressor module.

The compressor/decompressor 10 includes a compression/decompression processor 11, on which the compression/decompression software runs. The existing software is used to process and deliver real-time data to the network S11, as shown in FIG. 4. This data is simultaneously used to train the upgraded software S12 (as shown in FIG. 6). The compressor may be trained by inputting a copy of the real-time data stream. The decompressor may be trained by inputting the output of the compressor during training. In this way, the compression tables of both the compressor and decompressor should be synchronised, to ensure compatibility. This training may be performed in a training processor 12 of the compressor/decompressor. Alternatively, the training may be performed "in the cloud", i.e. in some other node. In the second case, once the training is complete, the other node sends an image of the trained upgraded software to a receiver 14 of the compressor/decompressor. The training may comprise building up a compression table of data patterns Gi and their respective signatures Ni.

In either approach, once the compressor/decompressor 10 has the upgraded, trained software, it activates an update handler 13. The update handler 13 deactivates the existing compression/decompression software S13, and configures the compression/decompression processor 11 to use the upgraded compression/decompression software S14. This switchover is illustrated in FIG. 7.

Figure 10:
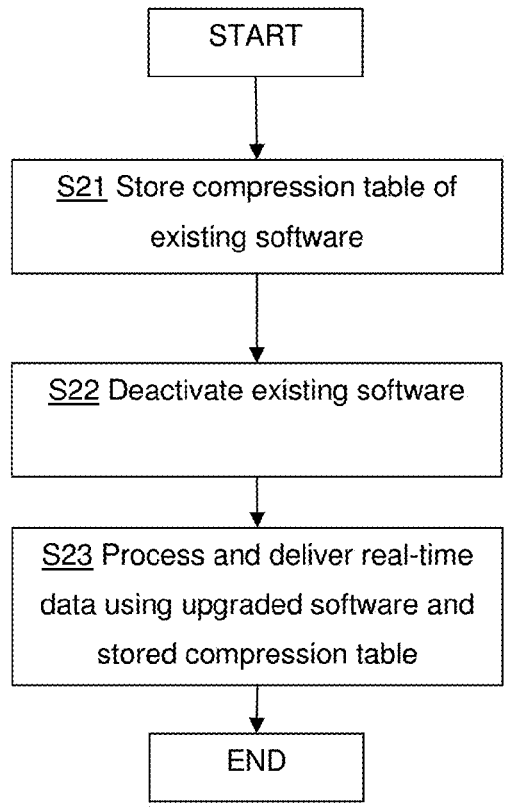
FIG. 10 is a flowchart showing a method according to a further approach.
Figure 11:
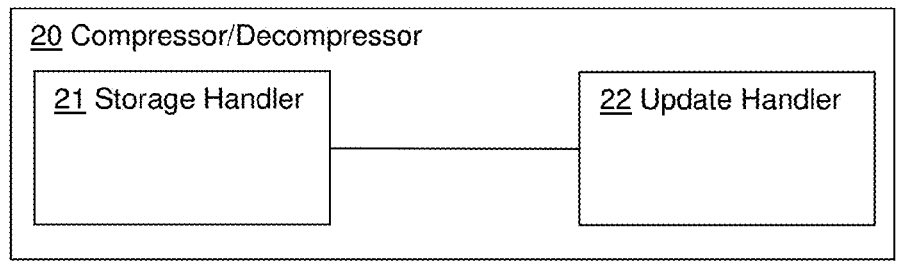
FIG. 11 illustrates schematically an apparatus for implementing the method of FIG. 10.

An alternative solution to the problem of minimising convergence time is shown in the flowchart of FIG. 10, and a suitable apparatus is illustrated in FIG. 11. The compression table of the existing software is stored S21 by a storage handler 21. This storage may be in a local memory unit, or on a remote storage server. The update handler 22 deactivates the existing software S21, retrieves the compression table, and then activates the upgraded software using the compression table S23. The upgraded software then uses the compression table to process and deliver the real-time data.

The existing compression table will not represent perfect convergence for the upgraded software, but is will be a considerable improvement over starting with a "blank slate". To improve the convergence time still further, this approach may be combined with the first approach, and the upgraded software may be initialised within a training environment using the existing compression table in order to further improve convergence.

In either solution, the switchover of software may be controlled by an external management node, which instructs the update handler 13 or 22 to initiate the switchover, and thus ensures that all compressor/decompressor nodes of the network perform the software upgrade simultaneously, ensuring that compatibility is maintained. Alternatively, switchover to the new software may be triggered by one side of the link, e.g. by the compressor inserting a control message into the data stream to cause the decompressor to switch versions, with the compressor switching versions immediately before or after sending the control message.

The compressor/decompressor may be located in a node in a telecommunications core or radio access network.

Although illustrated as software, it should be noted that the compressors, de-compressors, and/or nodes discussed herein could be implemented e.g. by one or more of: a processor or a micro processor and adequate software with suitable storage therefore, a Programmable Logic Device (PLD) or other electronic hardware component(s). It should also be noted that where a node or software element is referred to as a compressor/decompressor or similar, this could refer to a node or software element which acts as a compressor, a decompressor, or both as appropriate.

It is to be understood that the choice of interacting units or modules, as well as the naming of the units are only for exemplifying purpose, and nodes suitable to execute any of the methods described above may be configured in a plurality of alternative ways in order to be able to execute the disclosed process actions.

It should also be noted that the units or modules described in this disclosure are to be regarded as logical entities and not with necessity as separate physical entities. Although the description above contains many specific terms, these should not be construed as limiting the scope of this disclosure, but as merely providing illustrations of some of the presently preferred embodiments of the technology disclosed herein. It will be appreciated that the scope of the technology disclosed herein fully encompasses other embodiments which may become obvious to those skilled in the art, and that the scope of this disclosure is accordingly not to be limited. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed hereby. Moreover, it is not necessary for a device or method to address each and every problem sought to be solved by the technology disclosed herein, for it to be encompassed hereby.

In the preceding description, for purposes of explanation and not limitation, specific details are set forth such as particular architectures, interfaces, techniques, etc. in order to provide a thorough understanding of the disclosed technology. However, it will be apparent to those skilled in the art that the disclosed technology may be practiced in other embodiments that depart from these specific details. That is, those skilled in the art will be able to devise various arrangements which, although not explicitly described or shown herein, embody the principles of the disclosed technology. In some instances, detailed descriptions of well-known devices, circuits, and methods are omitted so as not to obscure the description of the disclosed technology with unnecessary detail. All statements herein reciting principles, aspects, and embodiments of the disclosed technology, as well as specific examples thereof, are intended to encompass both structural and functional equivalents thereof. Additionally, it is intended that such equivalents include both currently known equivalents as well as equivalents developed in the future, e.g., any elements developed that perform the same function, regardless of structure.

Thus, for example, it will be appreciated by those skilled in the art that block diagrams herein can represent conceptual views of illustrative circuitry or other functional units embodying the principles of the technology. Similarly, it will be appreciated that any flow charts, state transition diagrams, pseudo code, and the like represent various processes which may be substantially represented in computer readable medium and so executed by a computer or processor, whether or not such computer or processor is explicitly shown.

The functions of the various elements including functional blocks, including but not limited to those labelled or described as "compressor", "decompressor" or "node", may be provided through the use of hardware such as circuit hardware and/or hardware capable of executing software in the form of coded instructions stored on computer readable medium. Thus, such functions and illustrated functional blocks are to be understood as being either hardware-implemented and/or computer-implemented, and thus machine-implemented.

In terms of hardware implementation, the functional blocks may include or encompass, without limitation, digital signal processor (DSP) hardware, reduced instruction set processor, hardware (e.g., digital or analog) circuitry including but not limited to application specific integrated circuit(s) (ASIC), and (where appropriate) state machines capable of performing such functions.

The invention claimed is:

1. An apparatus configured to operate as a compressor and/or decompressor, the apparatus comprising:
    a compression/decompression processor for processing and delivering real-time data using existing compression/decompression software;
    a training processor for using the real-time data to train an upgraded compression/decompression software and building a compression table, wherein the upgraded compression software is trained by inputting a copy of the real-time data and the upgraded decompression software is trained by inputting the output of the upgraded compression software;
    an update handler for deactivating the existing compression/decompression software and configuring the compression/decompression processor to use the upgraded, trained compression/decompression software; and
    a sender for sending a signal to indicate that the upgraded compression/decompression software has been activated, wherein the compression/decompression processor is configured to insert said signal into the real time data.

2. The apparatus according to claim 1,
    wherein the update handler is configured to deactivate the existing compression/decompression software and configure the compression/decompression processor to use the upgraded, trained compression/decompression software in response to the training processor completing training the upgraded compression/decompression software.

3. The apparatus according to claim 1, wherein the compression table comprises data patterns and respective points or signatures.

4. The apparatus according to claim 1, further comprising:
    an image receiver for receiving an image of the upgraded, trained compression/decompression software.

5. The apparatus according to claim 1, wherein said apparatus is configured to operate as a node in a telecommunications core or radio access network.

6. The apparatus according to claim 1, further comprising a receiver for receiving a signal indicating that some other node has activated the upgraded compression/decompression software, wherein the upgrade handler is configured to deactivate the existing compression/decompression software and activate the upgraded compression/decompression software to process and deliver the real-time data in response to the receiver receiving said signal.

7. An apparatus configured to operate as a compressor and/or decompressor, the apparatus comprising:
    a storage handler for storing a compression table of existing compression/decompression software;
    a training processor for using real-time data to train an upgraded compression/decompression software, wherein the upgraded compression software is trained by inputting a copy of the real-time data and the upgraded decompression software is trained by inputting the output of the upgraded compression software;
    an upgrade handler for:
        deactivating the existing compression/decompression software; and
        activating upgraded compression/decompression software to process and deliver the real-time data in dependence upon the compression table of the deactivated compression/decompression software.

8. The apparatus according to claim 7, wherein the storage handler is configured to upload the compression table to a storage node, and retrieve the compression table from the storage node.

9. The apparatus according to claim 7, further comprising a memory unit, wherein the storage handler is configured to store the compression table in the memory unit.

10. A method of updating data compression/decompression software, the method comprising:
    training an upgraded compression/decompression software, wherein the training comprises using real-time data to train the upgraded compression software and using the output of the upgraded compression software to train the upgraded decompression software, wherein the training comprises building a compression table;
    at a compressor and/or decompressor function:
        processing and delivering the real-time data using an existing compression/decompression software; and
        following completion of the training process:
            deactivating the existing compression/decompression software; and activating the upgraded compression/decompression software to process and deliver the real-time data.

11. The method according to claim 10, wherein the step of training the upgraded compression/decompression software occurs at the compressor and/or decompressor function.

12. The method according to claim 10, wherein the step of training the upgraded compression/decompression software occurs at a node other than a node comprising the compressor and/or decompressor function, the method comprising:
    at the other node:
        sending an image of the trained, upgraded compression/decompression software towards the compressor and/or decompressor function;
    at the compressor and/or decompressor function:
        receiving the image of the trained, upgraded compression/decompression software.

13. The method according to claim 10, wherein the compression table comprises data patterns and respective points or signatures.

14. The method according to claim 10, wherein the compressor and/or decompressor function is located at a node in a telecommunications core or radio access network.

15. The method according to claim 10, further comprising sending a signal to indicate that the upgraded compression/decompression function has been activated.

16. The method according to claim 10, further comprising performing the steps of deactivating the existing compression/decompression software and activating the upgraded compression/decompression software to process and deliver the real-time data in response to receiving a signal indicating that some other node has activated the upgraded compression/decompression software.

17. A computer program comprising computer readable code which, when run on an apparatus, causes the apparatus to perform the method of claim 10.

18. A computer program product comprising a non-transitory computer readable medium and computer readable code according to claim 17, wherein the computer readable code is stored on the non-transitory computer readable medium.

19. A method of updating data compression/decompression software, the method comprising:

at a compressor and/or decompressor function:

storing a compression table of existing compression/decompression software;

training an upgraded compression/decompression software, wherein the training comprises using real-time data to train the upgraded compression software and using the output of the upgraded compression software to train the upgraded decompression software;

deactivating the existing compression/decompression software; and activating the upgraded compression/decompression software to process and deliver the real-time data in dependence upon the compression table of the deactivated compression/decompression software.

20. The method according to claim 19, wherein the step of storing the compression table comprises uploading the compression table to a storage node, and the method further comprising retrieving the compression table from the storage node.

21. The method according to claim 15, wherein said signal is inserted into the real time data.

* * * * *